United States Patent [19]

Underhill et al.

[11] 4,380,743

[45] Apr. 19, 1983

[54] FREQUENCY SYNTHESIZER OF THE PHASE LOCK LOOP TYPE

[75] Inventors: Michael J. Underhill; Nigel J. Walters, both of Horsham, England

[73] Assignee: U.S. Philips Corporation, New York, N.Y.

[21] Appl. No.: 226,326

[22] Filed: Jan. 19, 1981

[30] Foreign Application Priority Data

Jan. 21, 1980 [GB] United Kingdom ................. 8001889

[51] Int. Cl.³ ............................................. H03L 7/18
[52] U.S. Cl. .................................... 331/1 A; 331/16; 331/25; 307/271
[58] Field of Search .......................... 331/1 A, 16–18, 331/25; 307/271; 328/14, 15

[56] References Cited

U.S. PATENT DOCUMENTS 3,928,813  12/1975  Kingsford-Smith ................ 331/1 A
4,179,670  12/1979  Kingsbury ......................... 331/16 X

FOREIGN PATENT DOCUMENTS

1447418  8/1976  United Kingdom .

Primary Examiner—Siegfried H. Grimm
Assistant Examiner—Edward P. Westin
Attorney, Agent, or Firm—Robert J. Kraus

[57] ABSTRACT

In a phase lock loop frequency synthesizer, a successive addition rate multiplier provides a correction signal for eliminating ripple in a frequency control signal applied to a variable frequency oscillator which produces the output frequency of the synthesizer. Ripple elimination is improved by means of a feedback loop by which any residual ripple is detected and the correction signal is automatically adjusted.

8 Claims, 7 Drawing Figures

FREQUENCY SYNTHESIZER OF THE PHASE LOCK LOOP TYPE

BACKGROUND OF THE INVENTION

This invention relates to frequency synthesisers of the phase lock loop type. Such synthesisers include a voltage controlled variable frequency oscillator (VFO), a high stability clock pulse generator serving as a frequency reference, dividing means for reducing the frequency of the signal produced by the VFO, and a phase comparator which compares the relative phases of the signals produced by the dividing means and generator, the output of the phase comparator being applied as a frequency control signal via a loop filter to the VFO.

The invention more particularly relates to such synthesisers in which the dividing means at least includes a successive addition rate multiplier of the type which, for each input pulse, adds a predetermined increment Y to any accumulated value stored in an accumulator therein and gives an overflow pulse each time the capacity C (where $C \geq Y$) of the accumulator is reached or exceeded, whilst leaving any excess as a residue in the accumulator.

Successive addition rate multipliers, sometimes referred to as adjustable accumulators because the increment Y is usually adjustable in order to change the frequency division ratio, have the particular advantage that—as explained in United Kingdom Patent Specification No. 1,447,418—the residue in the accumulator at any time is a direct function of the time interval between the instant of occurrence of the immediately-preceding overflow pulse and the instant at which that pulse would have occurred if all the pulses were evenly spaced in time (i.e. with no phase jitter). The patent specification shows how this residue can be used to provide a correction signal which, when added to the output signal of the phase comparator in the appropriate sense and magnitude, compensates for any variation in the latter caused by the jitter in the pulse rate of the overflow pulses. Thus any wandering of the VFO frequency due to the jitter is considerably reduced by the correction signal which, in effect, predicts the phase jitter and compensates therefor.

Tests on the said known synthesiser showed that, in order for the effect of the jitter caused by the subtraction of pulses by the rate multiplier to be inaudible on a pure tone, the cancellation of the sidebands by the correction signal had to reduce them from a level greater than the carrier to about $-30$ dB with respect to the carrier. This requires an accuracy of about 3% in the nulling of the jitter and this is difficult where a wide frequency range, for example 20:1, is required. This gives rise to the problems that not only are close tolerance components required but also a difficult 'setting up' procedure is involved. A further difficulty is that temperature drift in some of the components also affect the accuracy and might even make the 3% impossible to achieve in some circumstances.

SUMMARY OF THE INVENTION

The object of the present invention is to provide a frequency synthesiser of the above-described type which gives improved nulling accuracy, hence reducing the need for close tolerance components, and in which the effects of temperature drift are substantially eliminated.

Accordingly, the invention provides a frequency synthesiser of the phase lock loop type including a voltage controlled variable frequency oscillator (VFO), a clock pulse generator, dividing means for reducing the frequency of the VFO and/or the generator, a phase comparator which compares the relative phases of the signals produced by the VFO and generator after division. The output of the phase comparator is applied as a frequency control signal via a loop filter to the VFO. The output of the dividing means is connected to a sccessive addition rate multiplier of the type which, for each input pulse applied thereto, adds a predetermined increment Y to any accumulated value stored in an accumulator therein and gives an overflow pulse each time the capacity C (where $C \geq Y$) of the accumulator is reached or exceeded whilst leaving any excess as a residue in the accumulator. The residue is used to derive a correction signal which modulates either an input to, or the output of, the phase comparator in such a way as the compensate for any variation in the frequency control signal that would otherwise occur due to jitter in the pulse repetition rate caused by the dividing means. The correction signal is a function of both the residue and of any ripple appearing on the frequency control signals.

In effect, a feedback loop is provided which detects any residual ripple in the frequency control signal due to any error in the level of the correction signal and automatically adjusts the correction signal to eliminate the ripple. This has the further advantage that the automatic compensation system maintains the correction signal at its correct level despite temperature drift. The frequency synthesiser according to the invention is particularly suitable for use in manpack and mobile radio system which are subject to vibration and a wide temperature range and in which a small frequency step size is required (e.g. for single sideband operation).

Preferably, the residue is converted to analogue form by a digital-to-analogue converter and the correction signal is formed by a first analogue multiplier which multiplies the output of the converter by said function of any ripple appearing on the frequency control signal. This has the practical advantage that in some cases the digital-to-analogue converter and the first multiplier can be combined in the form of a single commercially available integrated circuit, hence reducing the cost.

The function of the ripple may be derived from the output of a second multiplier which correlates any ripple component of the frequency control with the output of the digital to analogue converter. In a currently-preferred embodiment, however, the function of the ripple is derived from the output of a second multiplier which correlates any ripple component of the frequency control signal with the overflow pulse signals from the rate multiplier. The latter embodiment is preferred because the phase jumps detected are independent of the loop response.

In the latter embodiment, it is advantageous if the second multiplier multiplies the ripple component by $+1$ or $-1$ according to the state of the overflow pulse output of the rate multiplier. In this way, the multiplier can be implemented in a very simple manner.

The correction signal can be used in various ways to compensate for jitter in the frequency control signal. In one embodiment, the output or the phase comparator is fed to a summation device in which it is summed with the correction signal to form the frequency control signal. The summation method is similar to that shown

BRIEF DESCRIPTION OF THE DRAWING

Embodiments of the invention will now be described with reference to the accompanying drawing, of which.

DESCRIPTION OF THE PREFERRED EMBODIMENTS

Figure 1:
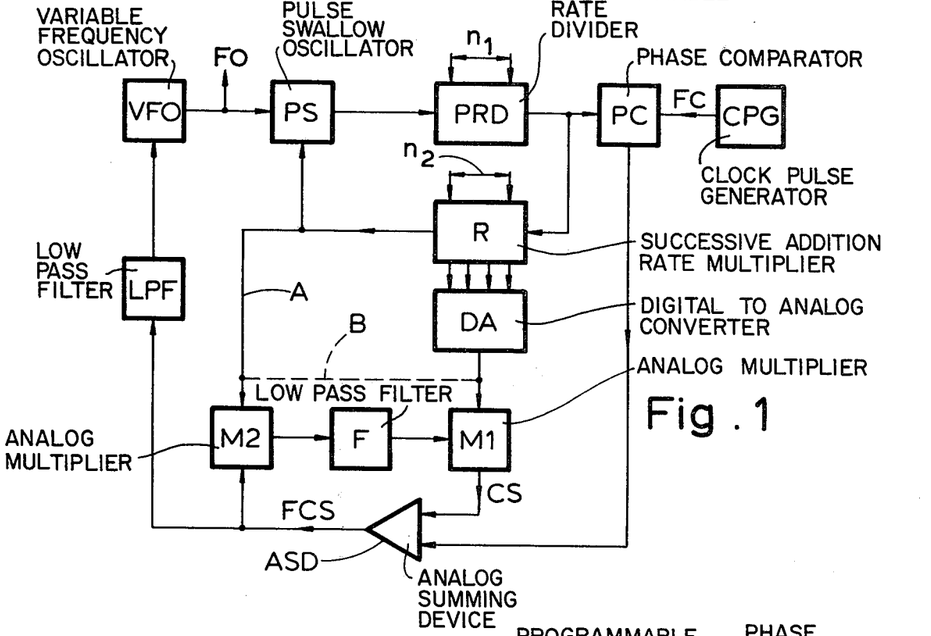
FIG. 1 is a block schematic circuit diagram of a first frequency synthesiser according to the invention.

FIG. 1 shows a block schematic circuit diagram of a first embodiment of the invention comprising a voltage-controlled variable frequency oscillator VFO the output of which constitutes the synthesiser output and is also connected to one input of a pulse swallow circuit PS. The output of circuit PS is connected to a programmable rate divider PRD which divides by an adjustable number $n_1 > 1$. The output of divider PRD is connected to one input of a phase comparator PC and also to the input of a successive addition rate multiplier R of the type defined above. The digital residue in the rate multiplier R is converted to analogue form by digital-to-analogue converter DA the output of which is connected to one input of an analogue multiplier M1. The overflow pulse output of rate multiplier R is connected to a second input of pulse swallow circuit PS and to one input of a second multiplier M2. The overflow pulses have an average frequency of $n_2$ times that of the input pulses from divider PRD, where $n_2$ is an adjustable number less than one.

The output of a clock pulse generator CPG, having an output frequency Fc, is connected to a second input of comparator PC the output of which is connected to one input of an analogue summing device ASD. The output of device ASD is connected via a low pass loop filter to the frequency control voltage input of the oscillator VFO and is also connected to a second input of multiplier M2. The output of multiplier M2 is fed via a low-pass filter F to a second input of multiplier M1.

Figure 2:
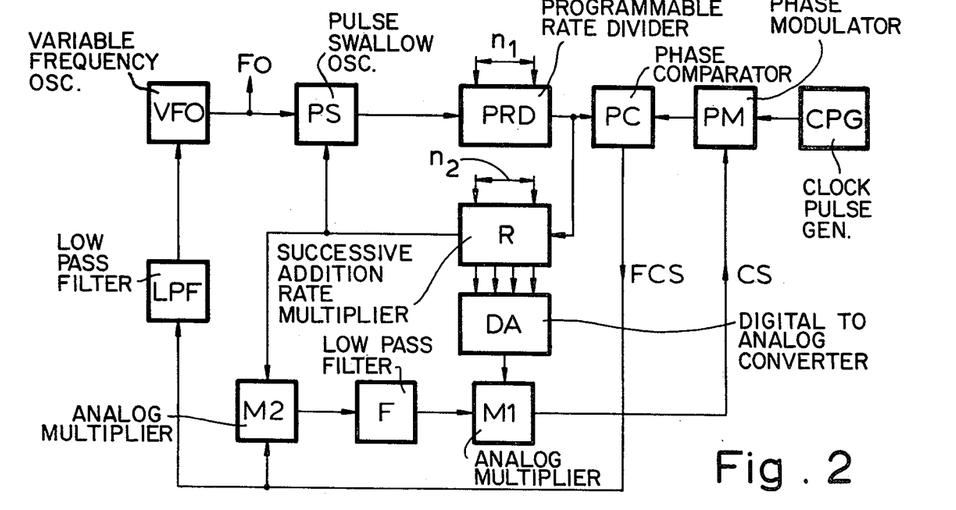
FIG. 2 is a block schematic circuit diagram of a second frequency synthesiser according to the invention.

The elements designated VFO, PS, PRD, PC, CPG, ASD, LPF, R, and DA are the same as the correspondingly designated items in FIG. 2 of said United Kingdom Patent Specification No. 1,447,418 and their functions and operations are described in detail therein. Briefly, the output of phase comparator PC adjusts the frequency of the oscillator VFO until the phase of the input pulses from divider PRD is the same as that of the frequency Fc. In the locked condition of the phase lock loop VFO-PS-PRD-PC-ASD-LPF-VFO, the output frequency $Fo = (n_1 + n_2) Fc$. Pulse swallow circuit PS has two pulse train inputs and subtracts, i.e. 'swallows', a pulse from one train (from oscillator VFO) for each input pulse from the other train (from rate multiplier R). Thus the output pulses from circuit PS are not evenly spaced in time due to the missing swallowed pulses; this is to say that they suffer from phase jitter and, hence, the output pulses from divider PRD also suffer from phase jitter. Since the input pulses to phase comparator PC from generator CPG have no phase jitter, the output signal from comparator PC has a ripple component which is directly proportional to the phase jitter on the input pulses from divider PRD. Such a ripple would cause the output frequency of oscillator VFO to wander slightly and said United Kingdom Patent Specification shows how a correction signal CS (ignoring the effect of multiplier M1 for the moment) can be derived from rate multiplier R and added by device ASD, in appropriate sense and magnitude, to the output of comparator PC to provide a frequency control signal FCS in which the ripple is balanced out. The residue left in rate multiplier R after each overflow pulse is directly proportional to the magnitude of the phase jitter in the respective overflow pulse, that is to say the delay suffered by that pulse from an instant in time at which it would have occurred if all the overflow pulses were evenly spaced, i.e. jitter free. The digital residue is therefore converted to analogue form by digital-to-analogue converter DA to produce an analogue correction signal which is proportional to the unwanted ripple in the output of comparator PC so that the two signals may be added in device ASD to balance out the ripple.

It is to be noted that the particular arrangement of the division means PS, PRD, and R is not relevant to the invention, which is solely concerned with the derivation of the correction signal, and many alternative arrangements are possible—for example those shown in FIGS. 1 and 3 of said United Kingdom Patent Specification. The pulse swallow circuit PS may be implemented in known manner as a variable modulo prescaler which, for example, normally divides by 10 by divides by 11 on receipt of an overflow pulse so that only nine pulses are given out for every hundred input pulses instead of ten—i.e. a pulse has been swallowed in each counting cycle.

There may, however, still be some residual ripple in the frequency control signal FCS and the present invention enables this to be further reduced by arranging that the correction signal CS is not only a function of the residue in rate multiplier R but is also a function of any ripple appearing on the frequency control signal, the latter being derived via one input of the second multiplier M2 and filter F and the two analogue functions being combined in multiplier M1. The other multiplying input of multiplier M2 is fed via conductor A with the overflow signals from rate multiplier R with the result that the correction signal CS at the output of multiplier M1 is also a function of the overflow pulse signals which, in effect, cause the phase jitter. It is alternatively possible to omit conductor A and to feed multiplier M2 via conductor B with the analogue signal proportional to the residue in rate multiplier R. In this case, however, the detected jitter via multiplier M2 is subject to the loop response whereas the detected jitter using conductor A is independent of the loop response. Also, as will be described below with reference to FIG. 5, multiplier M2 can be implemented in a very simple manner if the overflow signals via conductor A are used.

The reason that either the signal via the conductor path A or the signal via conductor path B can be used for the input to multiplier M2 is that both these signals have a correlation with the uncorrected jitter signal FCS. The correlation is either positive or negative depending on whether the correction signal CS is too large or too small. In principle any signal correlated with the error signal FCS could be used.

The correction signal derived from converter Da and applied via multiplier M1 should, in theory, exactly cancel out, in device ASD, the phase errors introduced by the jitter caused by the swallowing of pulses in pulse swallow circuit PS. If the amplitude or the correction signal is in error for any reason, however, then the error appears as ripple at the output of device ASD. Any such residual ripple is detected in magnitude and sense by correlation in multiplier M2 with the signal on conductor A or B and the detected signal adjusts the amplitude of the correction signal accordingly via the filter F and multiplier M1. Thus multiplier M2, filter F, multiplier M1, and summing device ASD form an automatic error-nulling feedback loop, filter F being the nulling loop filter.

FIG. 2 shows a second embodiment of a frequency synthesiser according to the invention which is closely similar to that shown in FIG. 1, the only difference being that the analogue summing device ASD of FIG. 1 is replaced in FIG. 2 by a phase modulator PM in the path between the clock pulse generator CPG and phase comparator PC. The correction signal CS from multiplier M1 is now connected to the modulation input or phase modulator PM. In this embodiment the correction signal, which is representative of the phase jitter at the input of phase comparator PC from divider PRD, causes the modulator PM to phase modulate the signals from clock pulse generator CPG so that they exhibit precisely the same phase jitter as that on the signals from divider PRD. Thus the frequency control signal FCS from comparator PC should have no jitter component. If any ripple does, however, appear on the control signal then, as described with reference to the embodiment shown in FIG. 1, this ripple is detected by the multiplier M2 and the amplitude of the correction signal CS is automatically adjusted accordingly to eliminate the ripple.

Figure 3:
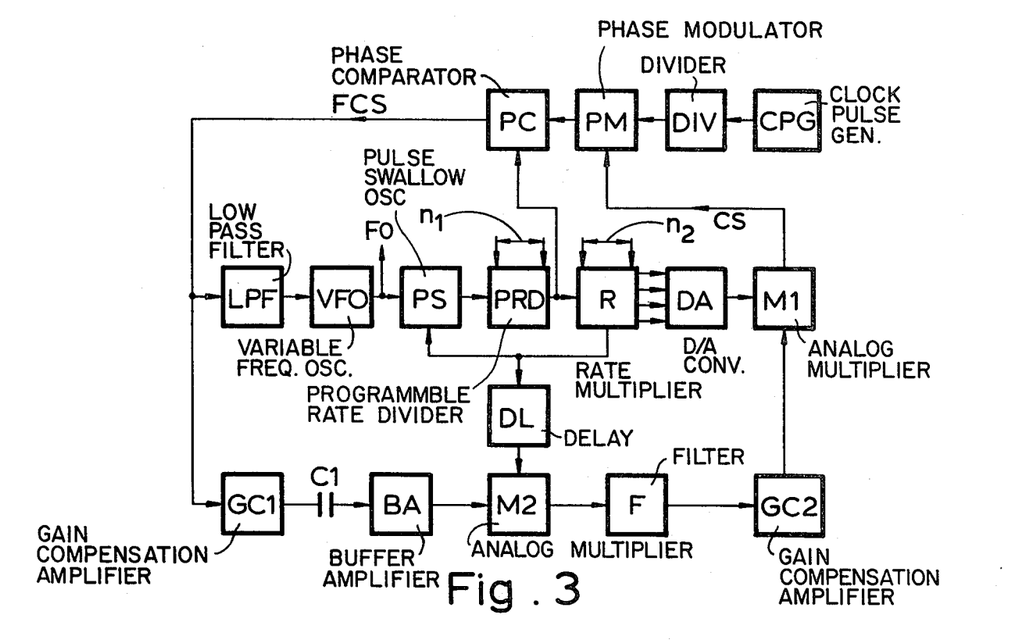
FIG. 3 shows the embodiment of FIG. 2 with the addition of gain compensation amplifiers.

If the frequency synthesiser is required to have a wide output frequency range, for example in the ratio 20:1, it is advantageous to include some form of frequency/gain compensation in order, inter alia, to reduce the settling time in the worst case condition when switching from a frequency at one end of the range to a frequency at the other end. FIG. 3 shows a modification of the embodiment shown in FIG. 2 which provides such compensation. The circuit blocks corresponding to those shown in FIG. 2 are given the same designations. The circuit between phase comparator PC and multiplier M2 now additionally includes a first gain compensation amplifier GC1 whose gain is proportional to frequency, a dc-blocking capacitor C1, and a unity gain buffer amplifier BA. The circuit between filter F and multiplier M1 now additionally includes a second gain compensation amplifier GC2 whose gain is inversely proportional to frequency, a delay DL which delays the overflow pulses from rate multiplier R to multiplier M2, and a fixed ratio divider DIV between generator CPG and phase modulator PM, the divider being included merely for convenience so that a high frequency (e.g. 5.12 MHz) crystal oscillator can be used.

The voltage step out of the phase comparator PC when a pulse is subtracted at the input to divider PRD is proportional to the length of the pulse subtracted by PS during one cycle of the VFO output frequency, and is therefore inversely proportional to the frequency. Thus the amplitude of the signals with which the automatic level adjusting circuitry has to deal can vary very widely, for example by about 20:1 in the case of a frequency synthesiser having an output frequency range from 1.6 MHz to 30 MHz. The inclusion of the gain compensation amplifier GC1, whose gain is proportional to frequency, overcomes this amplitude variation problem in that the signal amplitude fed to multiplier M2 now remains approximately constant with change of synthesiser frequency. It is to be noted that the gain compensation amplifier GC1 need not have an accurate gain/frequency characteristic because the loop automatically takes care of any residual inaccuracies. An example of a practical embodiment of amplifier GC1 will be described later with reference to FIG. 4.

The input to multiplier M2 should have no d.c. component so that the d.c. component at the output of multiplier M2 is only dependent upon the amplitude of the ripple in the frequency control signal FCS. The capacitor C1 blocks the input d.c. component. The elimination of the d.c. component may be effected in various alternative ways, for example by including a high pass filter in the input lead.

In the absence of the gain compensation amplifier GC2 the output of filter F would be inversely proportional to the synthesiser frequency because the amplitude required for the phase correction signal for example to phase modulator PM is inversely proportional to the VFO frequency. The amplitude of the correction signal is proportional to length of the pulse subtracted from the VFO output, during one period of the VFO output frequency, which is inversely proportional to the VFO frequency. When, for example, switching from the lowest frequency (1.6 MHz) to the highest frequency (30 MHz) the phase correction signal would start at the correct value for 1.6 MHz and would therefore be about twenty times too large for 30 MHz and the settling down time would be excessively long, e.g. 20 seconds. By providing gain compensation amplifier GC2, the gain of which is inversely proportional to frequency, the output of filter F is then substantially independent of the synthesiser frequency and the settling down time is very considerably reduced, for example to two seconds. The gain/frequency characteristic of gain compensation amplifier GC2 need not be very accurate because the correction loop automatically takes care of any residual inaccuracies.

In the embodiment shown in FIG. 2, the signal inputs to multiplier M2 comprise the overflow pulses from rate multiplier R and any resultant ripple in the frequency control signal FCS caused thereby. However the latter signal is delayed with respect to the former by the response times of pulse swallow circuit PS, divider PRD, and phase comparator PC. In order to correlate these two "cause and effect" signals accurately in multiplier M2 they should arrive substantially simultaneously. The overflow pulses fed to multiplier M2 are therefore delayed, in the embodiment shown in FIG. 3, by delay DL for a period equal to the sum of the response times.

The loop filter F was chosen to be an integrator with a fairly long time constant (100 mS) because it then not only removes any ripple at the output of multiplier M2 but also makes the whole system less sensitive to noise. The reason that a long time constant could be used is that the fastest response required, other than when changing frequency, is to keep up with changes caused by thermal drift.

The fixed ratio divider DIV has been added in the embodiment shown in FIG. 3, thus enabling a high frequency (e.g. 5.12 MHz) temperature compensated crystal oscillator to be used for clock pule generator CPG. Not only are such oscillators readily available commercially but they also have a negligible frequency drift with temperature. Also, in some applications of frequency synthesisers, one or more fixed frequency outputs are required in addition to the variable synthesised frequency. The divider DIV can provide one or more such fixed frequencies in addition to the frequency (typically 1000 Hz) supplied to the phase comparator PC.

Figure 4:
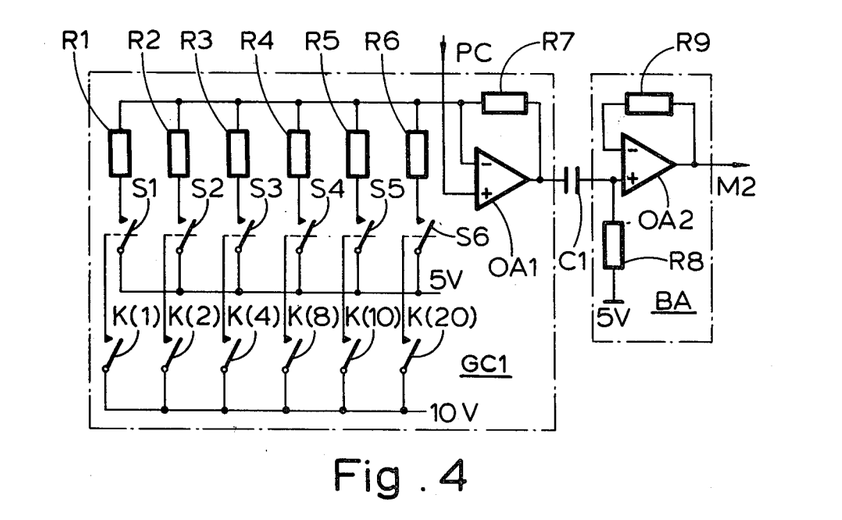
FIG. 4 is a circuit diagram of a first gain compensation amplifier and buffer amplifier suitable for use in the embodiment shown in FIG. 3.

FIG. 4 shows an example of a practical embodiment of gain compensation amplifier GC1 and buffer amplifier BA used on an experimental frequency synthesiser according to the invention and having a range of 1.6 MHz to 30 MHz adjustable in 100 Hz steps. The frequency is selected on switches (not shown) which include six contacts K for selecting the MHz data, namely 1, 2, 4, 8, 10 and 20 MHz, the appropriate frequency in MHz being shown in brackets adjacent each contact K in FIG. 4. The operation of each contact K operates a respective one of CMOS-type switches S1 to S6 each of which, when operated, connects a respective one of associated analogue resistors R1 to R6 to the 5V rail which is used as a ground reference for all analogue signals because the synthesiser operates from a single polarity supply. The amplifier comprises a differential operational amplifier OA1 including a non-inverting (+) input to which the output of phase comparator PC is connected. The ends of resistors R1 to R6 remote from switches S1 to S6 are connected in common to the inverting (−) input of amplifier OA1. The inverting input is also connected via feedback resistor R7 to the output of the amplifier OA1. The values of resistors R1 to R6 are proportioned to the value of resistor R7 in a known manner such that the output of amplifier OA1 is inversely proportional to the frequency determined by the setting of the MHz switch contacts K, for example (in ohms), R1=100k, R2=47k, R3=24k, R4=12k, R5=10k, R6=4.7k and R7=220k. As explained above, the gain compensation amplifier GC1 need only have an approximately linear gain-frequency characteristic and is therefore only adjusted in 1 MHz steps. For the same reason, the resistors R1 to R7 do not have to be of the low tolerance high stability type and, hence, are very inexpensive.

The switches S1 to S6 can be implemented most conveniently in CMOS integrated circuit form, for example integrated circuit type HEF4066 (Mullard Limited). In the practical circuit, this integrated circuit was powered by the 10 v supply and a respective 'pull-down' resistor (82 Kilohm, not shown) was connected between the 0 volt rail and the contact of each MHz switch contact K(1) to K(20) remote from the 10 volt rail to provide a logic 0 when the contact is open. Capacitor C1 had a value of 1μF.

Buffer amplifier BA comprises a differential operational amplifier OA2 the non-inverting (+) input of which is connected to the output of amplifier GC1 via capacitor C1 and to the 5 volt supply rail via resistor R8 (47 kilohms). The inverting (−) input is connected via a feedback resistor R9 (also 47 kilohms) to the output of amplifier OA2, which output is connected to multiplier M2 as shown in FIG. 3. Amplifiers OA1 and OA2 are readily available in integrated circuit form, for example type LM107 (Signetics or National Semiconductors).

Figure 5:
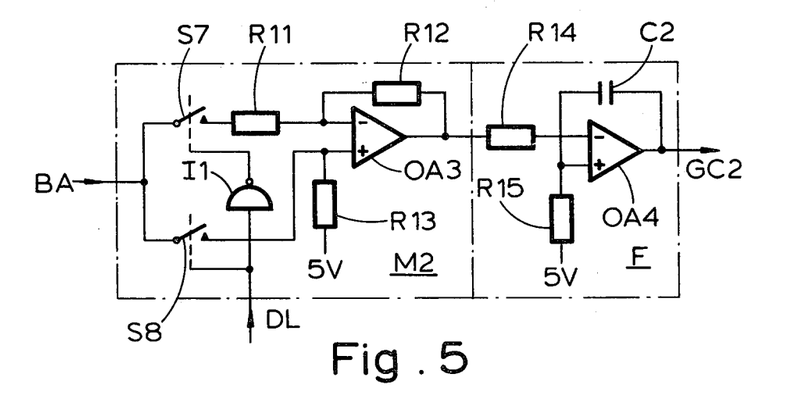
FIG. 5 is a circuit diagram of a second multiplier and filter suitable for use in the embodiment shown in FIG. 3.

FIG. 5 is a detailed circuit diagram of the second multiplier M2 and filter F. The output from buffer amplifier BA is connected to one contact of each of two electronic switches S7 and S8. The other contact of switch S7 is connected via a resistor R11 to the inverting (−) input of a differential operational amplifier OA3 and also via a feedback resistor R12 to the output of amplifier OA3. The other contact of switch S8 is connected to the non-inverting (+) input of amplifier OA3 and via a resistor R13 to the 5 volt supply rail. The signals from delay DL are arranged to operate switch S8 directly and switch S7 via an inverter I1. During a delayed overflow pulse from delay DL, therefore, switch S8 is operated and switch S7 is not operated. Due to the feedback resistor R12, the amplifier OA3 has unity gain and the output is equal to and has the same sign as the input; that is to say that the signal appearing from buffer amplifier BA is multiplied by +1 for the period of the delayed overflow pulse. When no pulse is present from delay DA, this state is inverted by inverter I1 and switch S7 is operated. The resistors R11 and R12 have the same value (10 kilohms, R13 also having the same value) and so the amplifier operates as a unity gain inverting amplifier; that is to say that at all times other than when a delayed overflow pulse is present, the signal from buffer amplifier BA is multiplied by −1. The sequence of + and − commands from the overflow pulse train is correlated with the error correction signal CS. Because the phase of the error signal FCS reverses depending on whether the jitter correction fed to the phase modulator is too high or too low the mean output of the correlating multiplier M2 also reverses at the same time since it effectively indicates the degree of positive or negative correlation.

Filter F is implemented as a well-known form of integrator, the input signal from multiplier M2 being fed to the inverting (−) input of a differential operational amplifier OA4 via resistor R14. The integrating time constant of the filter F is determined by capacitor C2 (100 nF) connected between the non-inverting (+) input and the output of amplifier OA4 and by resistor R15 (1 Megohm) connected between the non-inverting input and the 5 volt supply rail. The output of filter F is fed to the input of gain compensation amplifier GC2, a detailed circuit of which is shown in FIG. 6.

Figure 6:
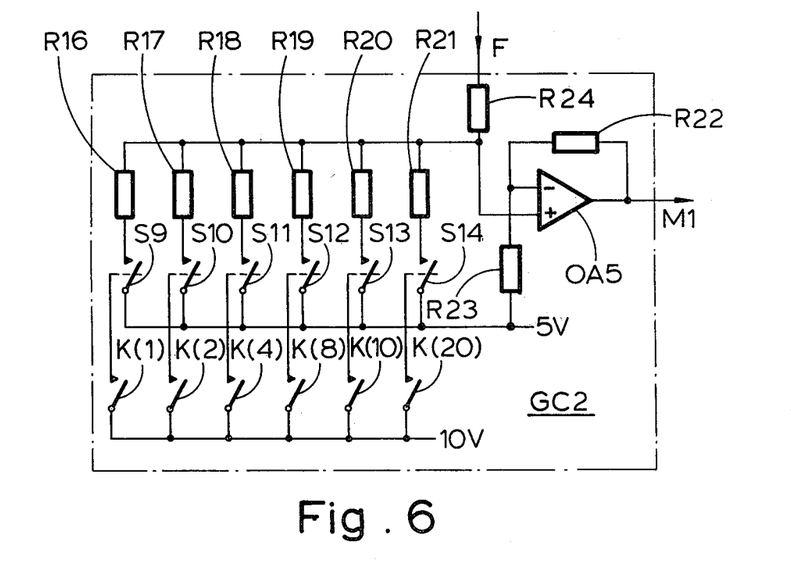
FIG. 6 is a circuit diagram of a second gain compensation amplifier suitable for use in the embodiment shown in FIG. 3.

FIG. 6 shows the gain compensation amplifier GC2 having a gain inversely proportional to frequency. It will be immediately evident that the gain/frequency control part of this circuit is the same as that shown in FIG. 4 for amplifier GC1. Resistors R16 to R21 have the same values as resistors R1 to R6, respectively, of FIG. 4 and contacts K(1) to K(20) are the same contacts as shown in FIG. 4 and the manner of operation of the switches S9 to S14 by the contacts K is the same as described with reference to FIG. 4. In the case of FIG. 6, however, the inputs to differential operational amplifier OA5 are in effect reversed with respect to FIG. 3 such that the gain of the amplifier is inversely proportional to frequency instead of being directly proportional. For this purpose, operational amplifier OA5 has its inverting (−) input connected to its outpt via a feedback resistor R22 (36 Kilohms) and to the 5 volt supply rail via a resistor R23 (18 kilohms). The output of gain compensation amplifier GC2 is connected to a multiplying input of analogue multiplier M1. Operational amplifiers OA3 and OA4 (FIG. 5), and OA5 (FIG. 6) are readily available commercially in integrated circuit form, for example OA3 and OA4 may be Signetics type LM107 and OA5 may be part of Signetics type LM124.

Figure 7:
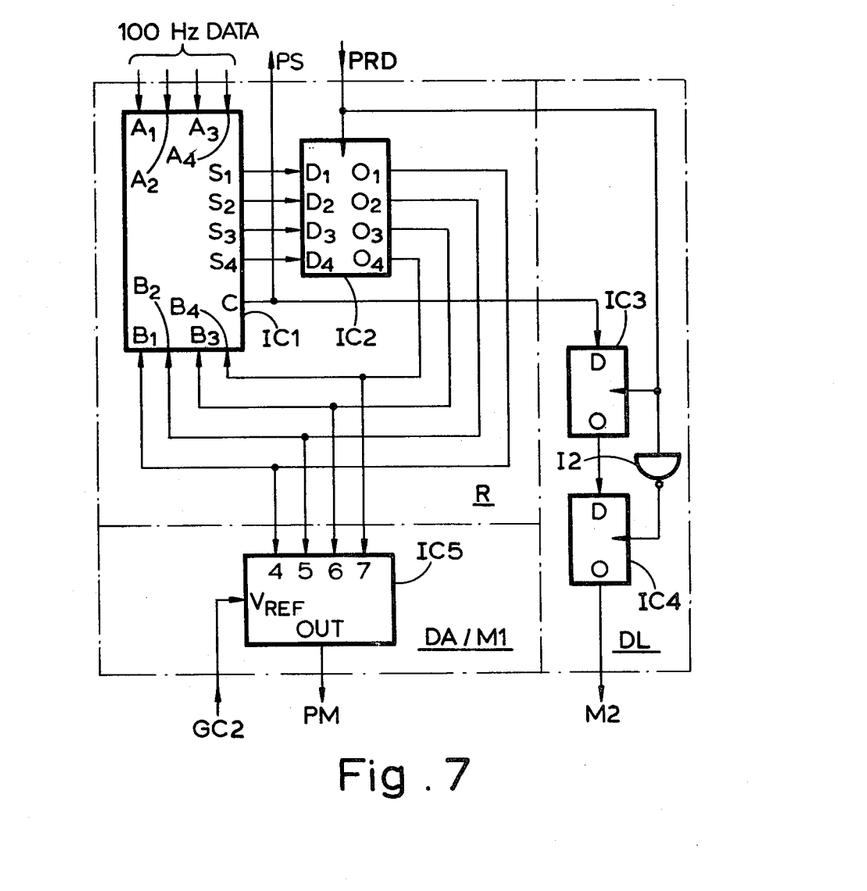
FIG. 7 is a circuit diagram of a successive addition rate multiplier, a multiplying-type digital-to-analogue converter, and a delay suitable for use in the embodiment shown in FIG. 3.

FIG. 7 shows a circuit including a successive addition rate multiplier R, a delay DL, and a multiplying-type digital to analogue converter DA/M1 which combines the separate items DA and M1 shown in FIG. 3.

The rate multiplier R is implemented by two integrated circuits IC1 and IC2, IC1 being a binary coded decimal full adder and IC2 being a group of D-type flip-flops clocked from a common clock input IP. Delay DL is implemented by two D-type flip-flops IC3 and IC4, and converter-multiplier DA/M1 is implemented by an integrated circuit IC5. The reference symbols shown in each circuit block are the relevant pin references of the commercial integrated circuits used (and detailed below).

In the experimental frequency synthesiser referred to above, having an output frequency range of 1.6 to 30 MHz adjustable in 100 Hz steps, the divider DIV shown in FIG. 3 divides the frequency (512 MHz) down to 1 kHz with the result that phase comparator PC adjusts the frequency of the oscillator VFO such that the output pulses from divider PRD, and hence the input pulses to rate multiplier R, are also at the 1 kHz rate. The 100 Hz data fed to the "A" adding inputs of circuit IC1 is in binary coded decimal form and is derived from the 100 Hz step switches used to set up the required output frequency Fo. Thus the setting of these switches determines the increment to be added in the rate multiplier each time a pulse from divider PRD is received by the multiplier, this input being fed as a trigger input to all the D-type flip-flops ($D_1$ to $D_4$) in circuit IC2 and to flip-flop IC3. For the purposes of explanation, it will be assumed that the 100 Hz step data setting is 700 Hz, the increment at the "A" inputs of circuit IC2 then being 7 (in binary coded decimal, or BCD, form). It will also be assumed that the outputs $O_1$ to $O_4$ of circuit IC2, and hence the "B" adding inputs of circuit IC1, are at zero. Although the circuits IC1 and IC2 operate on BCD signals, their operation will be explained with reference to the decimal values for convenience of description. Thus, the "S" (sum) output of adder IC1 is initially 7 at the "C" (carry) output is 0. The first pulse from divider PRD strobes the flip-flops $D_1$ to $D_4$ and the value 7 is transferred to the "B" inputs of adder IC1 and to the digital inputs (4 to 7) of circuit IC5. Adder circuit IC1 adds the two 7's to give 14 at its outputs, namely a 1 on the carry output "C" and 4 on the "S" outputs. The 1 on the C output forms the overflow pulse from rate multiplier R to the swallow circuit PS. The next (second) pulse from divider PRD transfers the 4 back to the "B" inputs of circuit IC1 which then adds this to the 7 on its "A" inputs to produce 11 at its "S" outputs, namely a further overflow pulse at its carry output "C" and 1 on the "S" outputs.

The second pulse from divider PRD also strobes the first overflow pulse on the "C" output of adder IC1 to the output of flip-flop IC3 and, hence, to the input D of flip-flop IC4. This second pulse from divider PRD is inverted by inverter I2 and so flip-flop IC4 is triggered at the end of the pulse to cause the first overflow pulse to be strobed to the output of flip-flop IC4 and, hence, to the input of multiplier M2 from delay D1 (FIG. 3). Thus the first (and each subsequent) overflow pulse is delayed by one period at the pulse train from divider PRD (at 1000 Hz rate) by delay DL.

The next (third) pulse from divider PRD strobes the value 1 at the "S" outputs of circuits IC1 to its "B" inputs and so the value 8 appears at the "S" outputs and 0 appears at the "C" output. Hence no overflow pulse is given. The third pulse also strobes the second overflow pulse to the output of flip-flop IC3 and, at the end of the pulse, via flip-flop IC4 to multiplier M2.

The process then continues in this fashion to produce seven overflow pulses for every ten input pulses from divider PRD.

Thus the value of $n_2$ (FIG. 3) is 0.7 in this case and the average frequency of the output pulses is the required 700 Hz. Circuit IC5 and OA6 converts each residue in rate multiplier R, appearing at the "O" output of circuit IC2 in which the residue is accumulated, to its analogue value and multiplies this value by the analogue signal at input $V_{REF}$ from gain compensation amplifier GC2, the product being fed to phase modulator PM as control signal CS to modulate the phase of the clock pulses appearing at the input to the modulator.

Integrated circuits IC1 to IC5 and OA6 in FIG. 7 are known per se and are commercially available in integrated circuit form, for example:-

| IC1 | BCD full adder | Motorola type MC14560 |
|---|---|---|
| IC2, IC3 | D-type flip-flops | Mullard type HEF 40174 |
| IC4 | D-type flip-flop | Mullard type HEF 40174 |
| IC5 | Multiplying DA converter | Analog Devices type AD 7523 |
| OA6 | Operational amplifier | Signetics LM 124 (part of) |

Clock pulse generator CPG, divider DIV, phase modulator PM, and phase comparator PC of FIG. 3 are all well known im the art and will not be further described since they are not directly relevant to the invention. In the practical embodiment, however, Mullard integrated circuit frequency synthesiser HEF4750 was used. This integrated circuit includes all the above four items except the oscillator crystal. A 5.12 MHz crystal was used and the reference divider section of the integrated circuit was wired to divide by 10 and then by 512 to produce 1 kHz clock pulses which are fed internally to the phase modulator, the output of which is fed to the phase comparator. The programmable rate divider PRD used was integrated circuit universal divider type HEF 4751 (Mullard Limited) and circuit PS was a programmable prescaler type SP8690 (Plessey Semiconductors Limited).

As is well known when constructing systems from standard integrated circuits, it is sometimes necessary to include level-shifting means for shifting the voltage level of the signals from one integrated circuit to another. This is due to the fact that the supply potentials required for the integrated circuits concerned may differ. In the practical embodiment described above, some circuits require 5 volts and others require 10 volts, this being the reason for the 5 and 10 volt supplies shown in FIGS. 4 to 6. The particular integrated circuit IC5 used in the embodiment was operated between the 5 and 10 volt rails and this required the input signals at terminals 4 to 7 to be shifted in level. To achieve this, a respective 82 kilohm resistor was included in series with each of the input leads to terminals 4 to 7 and each of these terminals was connected to the 10 volt rail via further respective 82 kilohm resistors. The level of the output signals from integrated circuit IC5 was then shifted so that their level was with respect to the 0 volt rail. Such level-shifting means are well known in the art and therefore need no further description herein.

We claim:

1. A phase lock loop type frequency synthesizer for producing a synthesized frequency signal comprising:
   (a) a variable frequency oscillator for providing the synthesized frequency signal in response to a frequency control signal;
   (b) a clock pulse generator for producing a reference frequency signal;
   (c) a phase comparator for comparing the phases of first and second signals applied to first and second inputs thereof, thereby effecting production of the frequency control signal;
   (d) first and second means for coupling the variable frequency oscillator output and the clock pulse generator output to the first and second inputs of the phase comparator, respectively, one of said means digitally reducing the frequency of the respective frequency signal and applying the reduced frequency signal to the respective input of the phase comparator;
   (e) a successive addition rate multiplier, including an accumulator, for adding a predetermined increment Y to any accumulated values stored in the accumulator in response to each pulse of the reduced frequency signal, said multiplier producing an overflow pulse each time the capacity C (where $C \geq Y$) of the accumulator is exceeded while leaving the excess as residue in the accumulator;
   (f) means for producing a correction signal in response to said residue; and
   (g) means coupled to the phase comparator for correcting the frequency control signal in response to the correction signal to compensate for any variation in the frequency control signal caused by jitter in the pulse rate of the reduced frequency signal; characterized in that the means for producing a correction signal further includes a feedback loop responsive to any residual ripple on the frequency control signal to eliminate said ripple.

2. A frequency synthesizer as in claim 1 wherein the means for producing a correction signal includes a digital-to-analog converter for converting the residue to an analog signal and a first analog multiplier for multiplying said analog signal by a ripple signal produced by the feedback loop representative of the residual ripple in the frequency control signal.

3. A frequency synthesizer as in claim 2 wherein the means for producing a correction signal includes a second multiplier responsive to the frequency control signal and to the analog signal, for producing the ripple signal.

4. A frequency synthesizer as in claim 2 wherein the means for producing a correction signal includes a second multiplier responsive to the frequency control signal and to the overflow pulses, for producing the ripple signal.

5. A frequency synthesizer as in claim 4 wherein the second multiplier multiplies the residual ripple by $+1$ or $-1$ in response to the presence or absence, respectively, of an overflow pulse.

6. A frequency synthesizer as in claim 5 wherein the second multiplier output if coupled to an input of the first multiplier by means of a low-pass filter.

7. A frequency synthesizer as in claim 1, 2, 3, 4, 5 or 6 including a summation device having inputs coupled to outputs of the phase comparator and the correction signal producing means to effect production of the frequency control signal.

8. A frequency synthesizer as in claim 1, 2, 3, 4, 5 or 6 including a phase modulator coupling the clock pulse generator to the phase comparator, said phase modulator modulating the phase of the reference signal in response to the correction signal.

* * * * *